United States Patent [19]
Hwang

[11] Patent Number: 5,812,373
[45] Date of Patent: Sep. 22, 1998

[54] HEAT DISSIPATING WEATHERTIGHT OUTDOOR ELECTRONICS ENCLOSURE

[75] Inventor: Liang Hwang, Bridgewater, N.J.

[73] Assignee: Lucent Technologies Inc., Murray Hill, N.J.

[21] Appl. No.: 821,549

[22] Filed: Mar. 21, 1997

[51] Int. Cl.[6] .................................................. H05K 7/20
[52] U.S. Cl. .................... 361/704; 361/690; 361/692; 361/694; 361/697; 361/720; 361/721; 361/724; 174/16.1; 165/80.2; 165/80.3
[58] Field of Search ........................ 361/688, 690, 361/692, 694, 697, 704, 720, 721, 724; 174/16.1; 165/80.2, 80.3

[56] References Cited

U.S. PATENT DOCUMENTS

| | | | |
|---|---|---|---|
| 4,858,069 | 8/1989 | Hughes | 361/696 |
| 5,258,888 | 11/1993 | Korinsky | 361/704 |

*Primary Examiner*—Leo P. Picard
*Assistant Examiner*—Boris L. Chervinsky

[57] ABSTRACT

An outdoor electronics enclosure which provides both weather protection and heat dissipation. The plastic enclosure is divided into two compartments. The first compartment has apertures in its exterior walls and contains an inner metal heat radiating box containing active electronic components. The second compartment is weathertight and contains passive components.

3 Claims, 3 Drawing Sheets

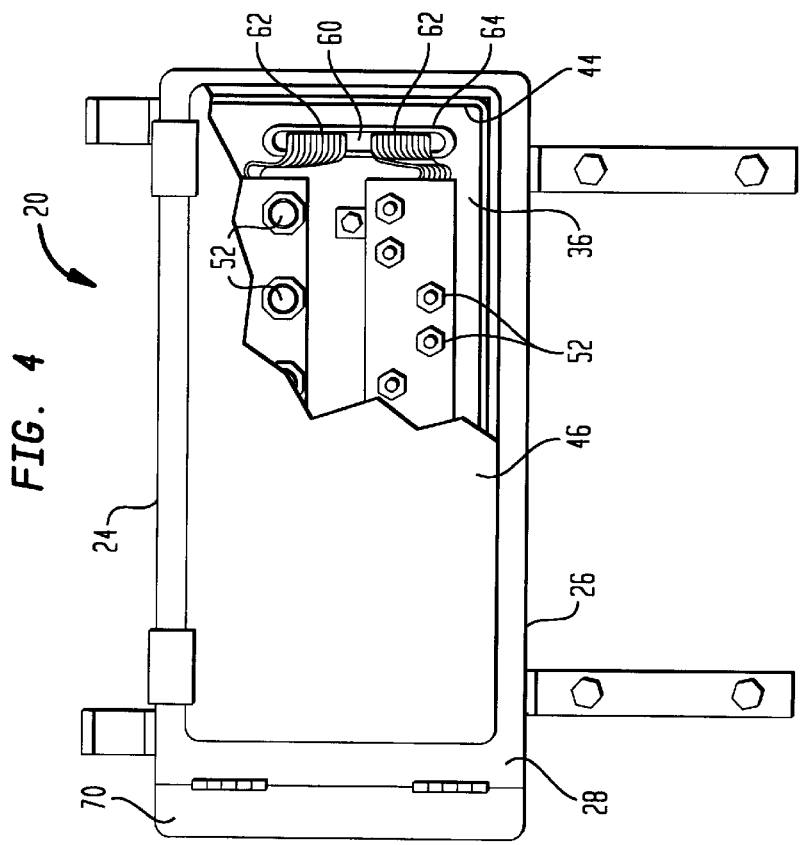
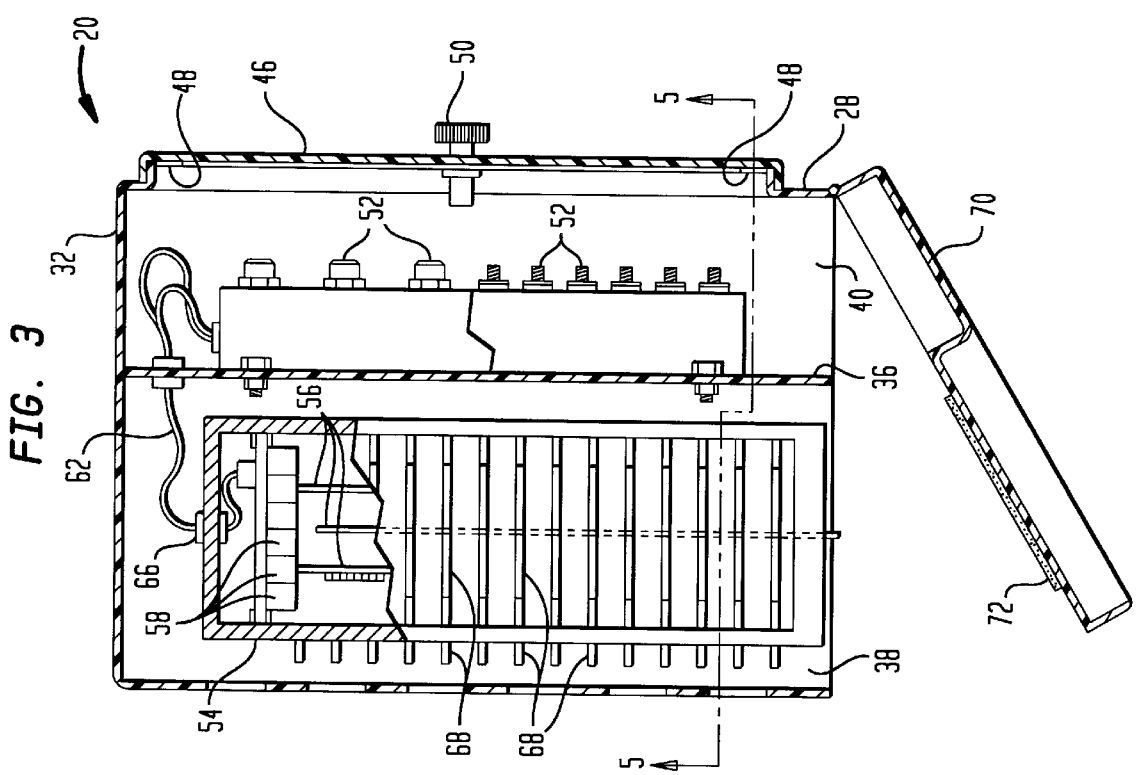

HEAT DISSIPATING WEATHERTIGHT OUTDOOR ELECTRONICS ENCLOSURE

BACKGROUND OF THE INVENTION

This invention relates to enclosures for electronic components and, more particularly, to such an enclosure which is designed for outdoor use and which is weathertight and provides heat dissipation for active components.

In recent years, telecommunications companies have been working to expand the services provided over their networks. To accommodate such expansion, there has been developed a hybrid fiber optic/coaxial cable access network. For such a network, a network interface unit (NIU) is provided on the premises of a customer. The NIU is typically mounted within an enclosure on the exterior of a building so that a technician can gain access thereto.

Typically, an NIU includes both active electronic components and passive components. The passive components include the terminations to the signal transmission media and the active components include modulators, demodulators, power ringing units providing power and ringing voltages for telephone service, etc. These active components generate heat which must be dissipated. In addition to providing the heat dissipation function, the enclosure for the NIU must also provide a weathertight protective cover for the components. To keep costs down, it would be desirable to provide a plastic enclosure. However, while such a plastic enclosure can be made weathertight, it does not have heat dissipating qualities. It would therefore be desirable to provide a cost effective enclosure which is both weatherproof and provides for heat dissipation.

SUMMARY OF THE INVENTION

According to the present invention, an exterior plastic enclosure is provided. This plastic enclosure is divided into two compartments. The passive components are mounted in the first compartment, which is weathertight, and are accessible through a sealable access door. The active components are mounted within a heat dissipating metal box, which in turn is mounted within the second compartment of the plastic enclosure. Exterior walls of the second compartment are formed with apertures to allow heat dissipation. A door providing access to the second compartment is arranged to seal the metal box to make it weathertight.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 3 is a partially cut away cross sectional view taken along the line 3—3 in FIG. 2;

FIG. 4 is a partially cut away front view of the enclosure shown in FIG. 2; and

DETAILED DESCRIPTION

Figure 5:
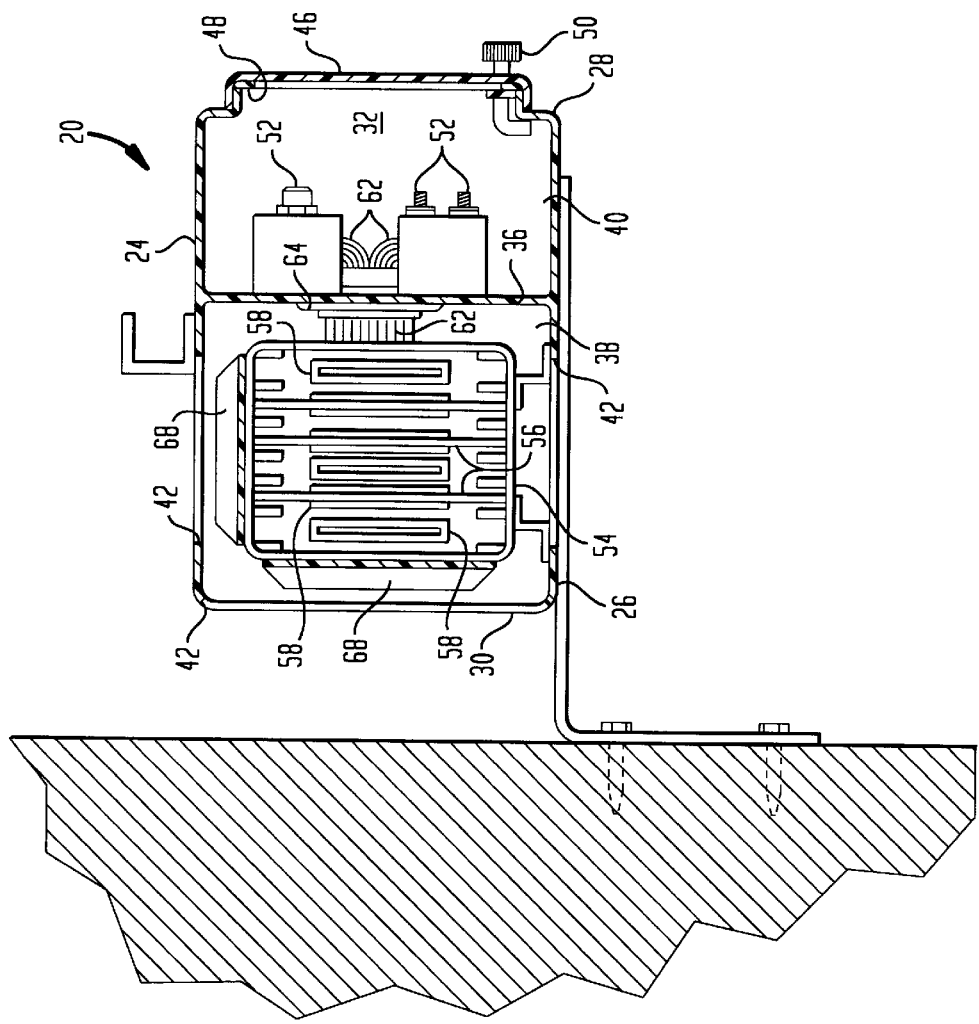
FIG. 5 is a cross sectional view taken along the line 5—5 in FIG. 3, and also illustrating one way of mounting the enclosure to the outside of a building.
Figure 1:
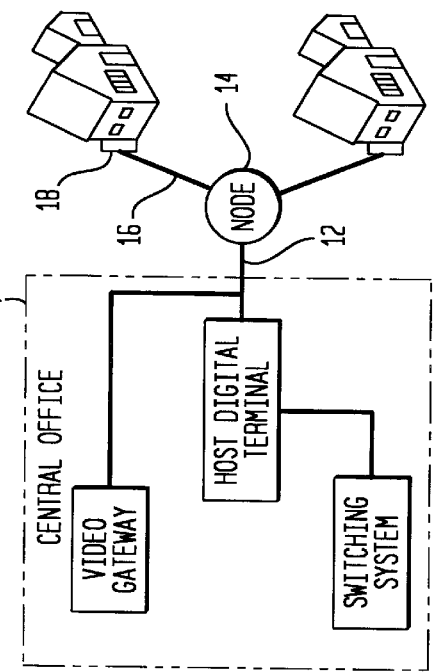
FIG. 1 is a block diagram illustrative a hybrid fiber optic/coaxial cable access network in which the present invention finds utility.
Figure 2:
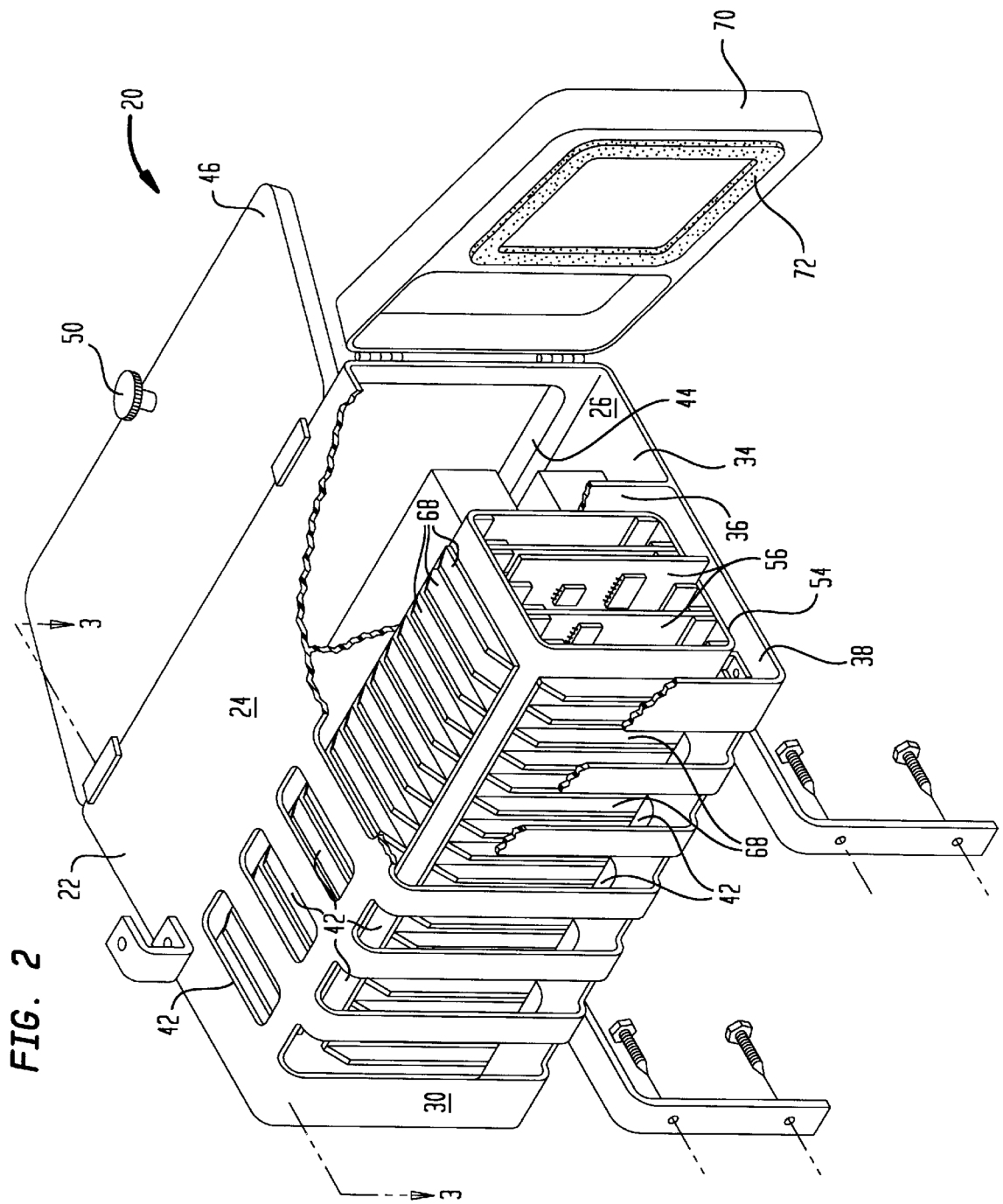
FIG. 2 is a partially cut away perspective view showing the enclosure according to the present invention.

As shown in FIG. 1, the present invention finds utility in a hybrid fiber optic/coaxial cable access network wherein the central office (or head end) 10 is connected by fiber optic cable 12 to a node 14. The node 14 is relatively close to the customers and a relatively short coaxial cable 16 extends to a network interface unit 18 mounted within an enclosure on the exterior of the customer's building. As previously discussed, the network interface unit 18 includes both active electronic components and passive components. The active components are mounted on cards which are changeable either to effect a repair or to change the customer's service. The enclosure for the network interface unit must therefore provide access to the active components. Likewise, the enclosure must provide access to the passive components, which includes the terminations to the signal transmission media going into the customer's building and toward the node 14. The enclosure must also be weathertight to protect the components, while at the same time allow for heat dissipation from the active components.

FIGS. 2–5 illustrate an enclosure, designated generally by the reference numeral 20, for the network interface unit 18 and constructed according to this invention. The enclosure 20 includes an outer container 22 having a top wall 24, a bottom wall 26, a front wall 28, a rear wall 30, and a side wall 32. The walls 24, 26, 28, 30, 32 define an interior cavity 34 which is open opposite the side wall 32. An interior wall 36 extends between the top wall 24 and the bottom wall 26 to divide the interior cavity 34 into a first compartment 38 and a second compartment 40. The top wall 24, the bottom wall 26, and the rear wall 30 are formed with apertures 42 which communicate with the first compartment 38. The front wall 28 is formed with an access opening 44 which communicates with the second compartment 40 opposite the interior wall 36.

A first door 46 is hingedly mounted to the front wall 28 adjacent the access opening 44. The door 46 is selectively positionable to either expose or cover the opening 44 and has a seal member 48 mounted on its inside surface for providing a weathertight seal around the access opening 44 between the front wall 28 and the door 46 when the door 46 is positioned to cover the opening 44. A latch/handle 50 is provided to maintain the door 46 in its closed position and maintain a slight compression to the seal member 48. The passive components of the network interface unit 18 are mounted to the interior wall 38 where they are accessible through the access opening 44. As shown, these passive components include signal transmission media terminations 52 which must be accessible to enable a technician to make changes thereto.

In order to support the active components, provide a weathertight enclosure therefor, and at the same time allow for heat dissipation therefrom, a metal box 54 is provided. The box 54 is six-sided, with one open side, and is mounted within the first compartment 38. As previously discussed, the active components of the network interface unit 18 are mounted to circuit cards 56. Accordingly, one or more circuit card connectors 58 are mounted within the box 54 away from its open side so that the circuit cards 56 can be inserted into the box 54 from its open side and engage suitable connectors 58. The interior wall 36 is formed with an aperture 60, and cabling 62 passes through the aperture 60 to couple the connectors 58 to the terminations 52. A sealing gasket 64 within the aperture 60 surrounds the cabling 62 to maintain the weathertight integrity of the interior wall 36, and a suitable gasket 66 maintains the weathertight integrity of the metal box 54 at an aperture which allows the cabling 62 to enter/exit the box 54.

To improve the heat dissipation qualities of the box 54, a plurality of heat radiating fins 68 are provided on the exterior of the box 54. The apertures 42 of the outer container 22 allow heat dissipated by the box 54 and the fins 68 to escape.

To provide access to the box 54 so that the circuit cards 56 can be installed and/or removed, the outer container 22 is provided with a second door 70 which is hingedly mounted to the container 22 adjacent its open end. A seal 72 mounted to the interior of the door 70 is so positioned that when the door 70 is closed, the seal 72 engages the open end of the box 54 to provide a weathertight seal between the box 54 and the interior of the door 70.

Thus, the box 54 provides for heat dissipation from the active components and, together with the seal 72 on the door 70, a weathertight enclosure for the active components, while the second compartment 40 of the outer container 22 provides a weathertight enclosure for the passive components 52, which do not require heat dissipation. Also, while allowing heat dissipation, the outer container 22 provides a solar shield for the box 54.

Accordingly, there has been disclosed an improved heat dissipating weathertight outdoor electronics enclosure for both active and passive components. While a preferred embodiment of the present invention has been disclosed herein, it will be apparent to one of ordinary skill in the art that various modifications and adaptations to the disclosed embodiment are possible and it is intended that this invention be limited only by the scope of the appended claims.

What is claimed is:

1. A weatherproof enclosure for electronics components including passive components and heat generating active components, the enclosure comprising:

an inner container of heat conducting material adapted for holding the active components therein, the inner container including a box having one open side and at least one component connector mounted to a side of said box opposite said one open side;

an outer container having an interior wall dividing said outer container into first and second compartments, said outer container having a plurality of apertures communicating with said first compartment, a first hinged door providing access to said first compartment and including a weathertight seal on an interior surface, and a second hinged door providing access to said second compartment;

wherein said inner container box is mounted within said outer container first compartment with said one open side engaging said first door seal when said first door is closed; and wherein said passive components are mounted in said second compartment so as to be accessible when said second door is open.

2. The enclosure according to claim 1 further including a weathertight seal on an interior surface of said second door which engages the outer container when the second door is closed.

3. A communications interface enclosure providing weatherproof containment and heat dissipation for active electronic components and weatherproof containment and accessibility for signal transmission media terminations, the enclosure comprising:

an outer container having a top wall, a bottom wall, a front wall, a rear wall and a side wall defining an interior cavity with an opening opposite said side wall, an interior wall extending between said top wall and said bottom wall to divide said interior cavity into a first compartment and a second compartment, said top, bottom and rear walls being each formed with a plurality of apertures communicating with said first compartment, said front wall being formed with an access opening communicating with said second compartment, and said signal transmission media terminations being mounted to said interior wall within said second compartment;

a first door hingedly mounted to said front wall adjacent said access opening and selectively positionable to either expose or cover said access opening;

a first seal member mounted to said first door and adapted to provide a weathertight seal around said access opening between said front wall and said first door when said first door is positioned to cover said access opening;

a second door hingedly mounted to said outer container adjacent said cavity opening and selectively positionable to either expose or cover at least part of said interior cavity opening;

a second seal member mounted to said second door;

an inner container of heat conducting material including a box having one open side, said inner container being mounted inside said first compartment of said outer container with said box one open side so situated as to sealingly engage said second seal member when said second door is positioned to cover said at least part of said interior cavity opening;

a component connector mounted to said box away from said one open side and adapted for electrically engaging within said box at least one of said active electronic components; and cabling interconnecting said connector with said signal transmission media terminations, wherein said interior wall has an aperture therein, said cabling passes through said aperture, and said cabling is surrounded by a sealing gasket within said aperture.

\* \* \* \* \*